(12) United States Patent
Heim et al.

(10) Patent No.: US 7,126,749 B2
(45) Date of Patent: Oct. 24, 2006

(54) SEMICONDUCTOR OPTICAL AMPLIFIER WITH LOW POLARIZATION GAIN DEPENDENCY

(75) Inventors: Peter J. S. Heim, Washington, DC (US); Mario Dagenais, Chevy Chase, MD (US); Simarjeet Saini, Columbia, MD (US); Xun Li, Burlington (CA)

(73) Assignee: Quantum Photonics, Inc., Jessup, MD (US)

( * ) Notice: Subject to any disclaimer, the term of this patent is extended or adjusted under 35 U.S.C. 154(b) by 753 days.

(21) Appl. No.: 10/323,630

(22) Filed: Dec. 20, 2002

(65) Prior Publication Data

US 2004/0120028 A1 Jun. 24, 2004

(51) Int. Cl.
*H01S 3/00* (2006.01)

(52) U.S. Cl. ..................................... 359/344
(58) Field of Classification Search ................ 359/344, 359/337; 372/6
See application file for complete search history.

(56) References Cited

U.S. PATENT DOCUMENTS

| | | | |
|---|---|---|---|
| 5,223,972 A * | 6/1993 | Nishimura et al. ......... 359/337 |
| 5,982,531 A | 11/1999 | Emery et al. | |
| 6,175,446 B1 * | 1/2001 | Alphonse ................... 359/344 |
| 6,310,720 B1 | 10/2001 | Walker et al. | |
| 6,549,331 B1 * | 4/2003 | Walker et al. ............. 359/344 |
| 2001/0043390 A1 | 11/2001 | Kim et al. | |

OTHER PUBLICATIONS

Fujita et al., "Integrated Multistack Waveguide Polarizer", IEEE Photonics Technology Letters, vol. 10, No. 1, Jan. 1998, pp. 93-95.
Mertens et al., "First Realized Polarization Converter Based on Hybrid Supermodes", IEEE Photonics Technology Letters, vol. 10, No. 3, Mar. 1998, pp. 388-390.
Gustavsson, "Analysis of Polarization Independent Optical Amplifiers. . .", IEEE Journal of Quantum Electronics, vol. 29, No. 4, Apr. 1993, pp. 1168-1178.
Burke et al., "Efficient Polarization Conversion in Silicon-On-Insulator Waveguides", Integrated Photonic Research Technical Digest, Jul. 17-19, Vancouver, Canada, 2002.
Van der Tol et al., "Realization of a Short Integrated Optic Passive Polarization Converter", IEEE Photonics Technology Letters, vol. 7, No. 8, Aug. 1995, pp. 893-895.
Huang et al., "Realization of a Compact and Single-Mode Optical Passive Polarization Converter", IEEE Photonics Technology Letters, vol. 12 No. 3, Mar. 2000, pp. 317-319.
Shani et al., "Polarization Rotation in Asymmetric Periodic Loaded Rib Waveguides", Appl. Phys. Lett. 59(11), Sep. 1991, pp. 1278-1280.
Koga et al., "Polarization Insensitive Optical Amplifier Consisting. . .", IEEE Photonics Tech. Letters, vol. 1, No. 12, Dec. 1989, pp. 431-433.
Shimada et al., "Optical Amplifiers and Their Applications", John Wiley & Sons, pp. 70-72.

* cited by examiner

*Primary Examiner*—Mark Hellner
(74) *Attorney, Agent, or Firm*—Potomac Patent Group PLLC

(57) ABSTRACT

A semiconductor optical amplifier (SOA) has an overall gain that is substantially polarization independent, i.e., less than 1 dB difference between transverse electric (TE) and transverse magnetic (TM) gain. The SOA includes gain and polarization rotation functions integrated onto a single substrate. According to one exemplary embodiment, a passive polarization rotation section is disposed between two active gain sections.

45 Claims, 3 Drawing Sheets

SEMICONDUCTOR OPTICAL AMPLIFIER WITH LOW POLARIZATION GAIN DEPENDENCY

BACKGROUND

The present invention relates generally to semiconductor optical amplifiers and, more particularly, to semiconductor optical amplifiers having low polarization gain dependency and methods of making such devices.

Technologies associated with the communication of information have evolved rapidly over the last several decades. Optical information communication technologies have evolved as the technology of choice for backbone information communication systems due to, among other things, their ability to provide large bandwidth, fast transmission speeds and high channel quality. Semiconductor lasers and optical amplifiers are used in many aspects of optical communication systems, for example to generate optical carriers in optical transceivers and to generate optically amplified signals in optical transmission systems. Among other things, optical amplifiers are used to compensate for the attenuation of optical data signals transmitted over long distances.

There are several different types of optical amplifiers being used in today's optical communication systems. In erbium-doped fiber amplifiers (EDFAs) and Raman amplifiers, the optical fiber itself acts as a gain medium that transfers energy from pump lasers to the optical data signal traveling therethrough. In semiconductor optical amplifiers (SOAs), an electrical current is used to pump the active region of a semiconductor device. The optical signal is input to the SOA from the optical fiber where it experiences gain due to stimulated emission as it passes through the active region of the SOA.

Like other devices employed in optical networks, SOAs suffer from polarization sensitivity. That is, the gain experienced by a light beam that is input to a conventional SOA will vary depending upon the polarization state of the input optical energy. In this context, the polarization state of a light beam is typically described by the orthogonal polarization components referred to as transverse electric (TE) and transverse magnetic (TM). Unfortunately even if light having a known (e.g., linear) polarization state is injected into a typical optical fiber (i.e., a single mode fiber) after propagation through the optical fiber the light will become elliptically polarized. This means that the light input to SOAs placed along the optical fiber will have TE and TM polarization components of unknown magnitude and phase, resulting in the gain applied by SOAs also varying indeterminately as a function of the polarization state of the input light.

There are various techniques that have been employed to compensate for the polarization dependent gain that is introduced by SOAs. One such technique, shown in FIG. 1, is to arrange two SOAs in series. In amplifier 10, the gain for TE mode light is greater than the gain for TM mode light. Amplifier 12 has the same structure as amplifier 10 but is rotated by 90 degrees so that the gain for TM mode light is greater than the gain for TE mode light, i.e., in reverse proportion to the polarization gain ratio for amplifier 10. In this way, the optical energy output from the combination of amplifiers 10 and 12 is substantially polarization independent. This technique can also be practiced by arranging the SOAs in parallel as described, for example, in the textbook *Optical Amplifiers and their Applications*, edited by S. Shimada and H. Ishio, published by John Wiley & Sons, Chapter 4, pp. 70–72, the disclosure of which is incorporated here by reference. A similar technique is described in the article entitled "Polarization Insensitive Optical Amplifier Consisting of Two Semiconductor Laser Amplifiers and a Polarization Insensitive Isolator in Series", by Koga et al., IEEE Photonics Technology Letters, Vol. 1, No. 12, December 1989, pp. 431–33, the disclosure of which is incorporated here by reference. Therein, two SOAs are separated by a polarization insensitive isolator in series. Another technique for compensating for polarization dependent gain is to use some other corrective device downstream of the SOA as shown in FIG. 2. For example, a variable polarization dependent loss control device 22 can be disposed downstream of the SOA 20 to compensate for unequal magnitudes of TE and TM gain. This technique is described in U.S. Pat. No. 6,310,720, the disclosure of which is incorporated here by reference. All of these techniques suffer from, among other things, the drawback of requiring a number of additional components to create a single polarization insensitive SOA, and the lack of integration of the components, thereby increasing the cost of the solutions. For example, the technique described in the Koga article employs a polarization insensitive optical isolator that is not amenable to monolithic integration with the two SOAs.

Attempts have also been made to provide an integrated solution to this problem, i.e., to design polarization insensitive SOAs. One such attempt is described in the article entitled "Analysis of Polarization Independent Optical Amplifiers and Filters Based on Polarization Rotation in Periodically Asymmetric Waveguides", by Mats Gustavsson, IEEE Journal of Quantum Electronics, Vol. 29, No. 4, April 1993, pp 1168–1178, the disclosure of which is incorporated herein by reference. Therein, a periodically asymmetric active waveguide is used to fabricate a polarization insensitive laser amplifier. However, as seen in FIG. 2 of this article, this device is only able to provide polarization insensitivity at one particular operating gain level. At other operating levels, the device is actually quite polarization sensitive. Another attempt at an integrated solution is found in U.S. Pat. No. 5,982,531 to Emery et al., the disclosure of which is incorporated here by reference. Therein, the active material in the SOA is subjected to a tensile strain sufficient to render the amplifier insensitive to the polarization of the light to be amplified. However, balancing the TE/TM gain using such techniques requires extremely accurate control over device geometry, layer thickness, layer composition and background absorption loss. In practice, this level of control is very difficult to achieve in a repeatable manufacturing process, i.e., there may be a significant variance in the polarization sensitivity of SOAs manufactured using such techniques from one manufacturing run to another.

Accordingly, Applicants would like to provide techniques and devices that provide monolithically integrated, polarization insensitive SOAs in a manner which facilitates manufacturing repeatability and which provides polarization insensitivity at different operating gain levels.

SUMMARY

Systems and methods according to the present invention address this need and others by providing polarization insensitive semiconductor optical amplifiers. According to exemplary embodiments of the present invention, semiconductor optical amplifiers have an overall gain (i.e., from device input to device output) that is substantially independent of the polarization state of the input, i.e., less than 1 dB difference between TE and TM overall gain. This is accomplished even though the active region of the SOA can have substantial (i.e. greater than 1 dB) polarization gain dependence. SOAs according to the present invention include gain and polarization rotation functions integrated onto a single substrate. According to one exemplary embodiment, a polarization rotation section is disposed between two active gain sections on the substrate.

According to another exemplary embodiment a semiconductor optical amplifier includes a substrate, a first gain section disposed on the substrate for providing gain to an optical signal, a first polarization rotation section, adjacent to the first gain section and disposed on the substrate, for rotating a polarization of the optical signal received from the first gain section and a second gain section, adjacent to the first polarization rotation section and disposed on the substrate, for providing gain to the optical signal received from the first polarization rotation section. According to another exemplary embodiment of the present invention, a semiconductor optical amplifier includes a substrate, at least one gain section for providing gain to an input optical signal and a polarization rotation device for rotating a polarization associated with the input optical signal. Both the at least one gain section and the polarization rotation device are integrated onto a common substrate. The overall gain of this semiconductor optical amplifier for a TE input signal and a TM input, differs by less than 1 dB.

BRIEF DESCRIPTION OF THE DRAWINGS

The accompanying drawings illustrate exemplary embodiments of the present invention, wherein.

DETAILED DESCRIPTION

Figure 1:
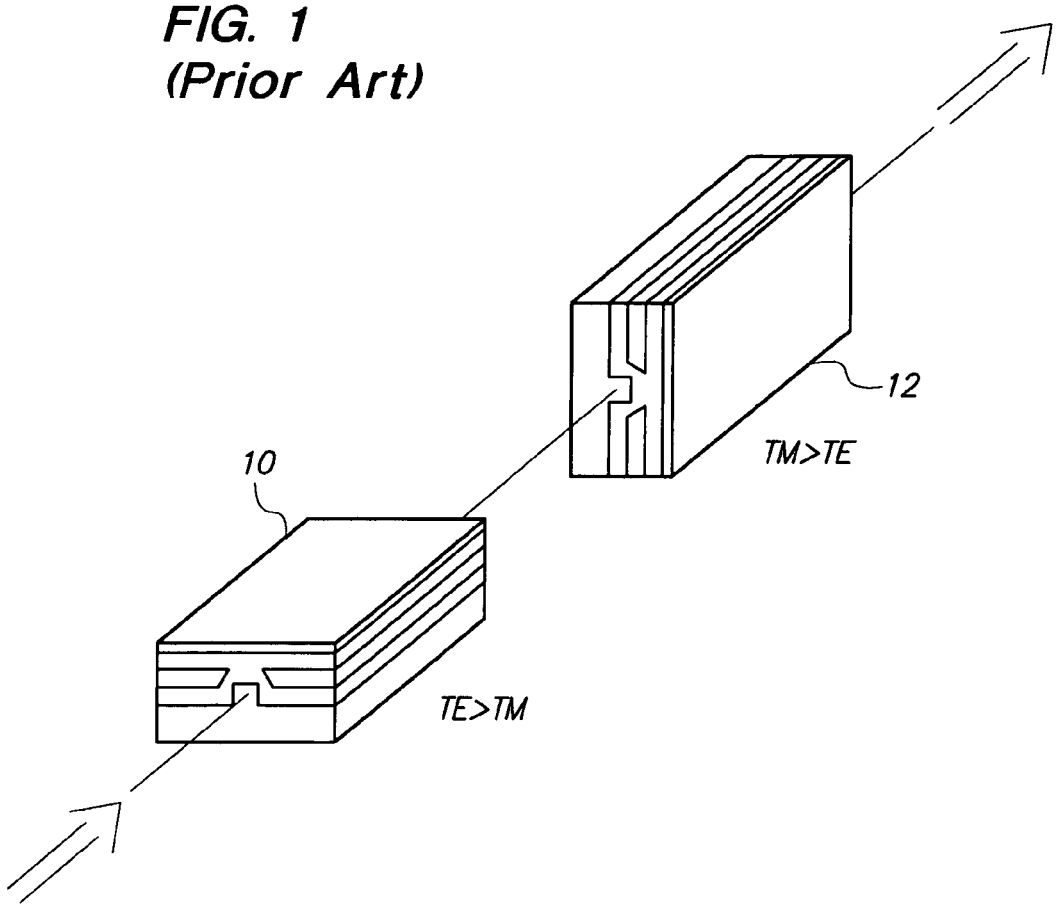
FIG. 1 depicts a conventional technique for compensating for polarization dependent gain of SOAs by employing two SOAs in series.
Figure 2:
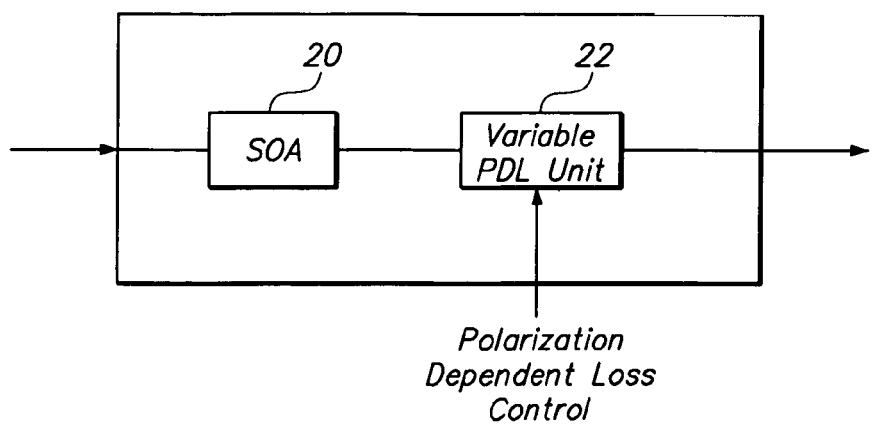
FIG. 2 depicts another conventional technique involving employing a downstream corrective device that adjusts the gain.

The following detailed description of the invention refers to the accompanying drawings. The same reference numbers in different drawings identify the same or similar elements. Also, the following detailed description does not limit the invention. Instead, the scope of the invention is defined by the appended claims.

Devices and methods according to exemplary embodiments of the present invention provide semiconductor optical amplifiers whose overall gain is substantially polarization independent, i.e., in the output of semiconductor optical amplifiers according to exemplary embodiments gain provided to input optical energy having a TE polarization is substantially equal to the gain provided to input optical energy having a TM polarization. In the context of the present invention, "substantially polarization independent" refers to a difference between TE and TM overall gain of less than 1 dB and, preferably, less than 0.5 dB. This quality of SOAs according to the present invention is achieved by, for example, the structure illustrated in FIG. 3. Therein, optical energy enters a first (active) gain section 30, which gain section 30 can, for example, be fabricated as a ridge-type, quantum well device. Those skilled in the art will appreciate that any gain structure can be employed for the gain sections employed herein, e.g., a buried-type device and/or bulk materials can be used to fabricate gain section 30. Multiple quantum wells (not shown) may be provided in gain section 30 using various materials, e.g., InAlGaAs, InGaAsP and InP, to create gain section 30 using well known techniques. This quantum well structure results in a predetermined amount of gain being transferred to the optical energy that passes therethrough. Specifically, a gain for TE and TM signals characterized by gain coefficient values $g_{TE}$ and $g_{TM}$, respectively, is applied to the optical energy in gain section 30, where $g_{TE} > g_{TM}$ or $g_{TM} > g_{TE}$ for the reasons described above with respect to the manufacture of SOA devices. The gain section 30 is driven by current $I_1$ and has a length $L_1$. Note that the value of the gain coefficients $g_{TE}$ and $g_{TM}$ depend on the magnitude of the current $I_1$. The gain applied to the optical signal in gain section 30 for a TE input signal $(G_{1,TE})$ and a TM input signal $(G_{1,TM})$ is given by the following equations: $G_{1,TE} = e^{g_{TE}L_1}$, $G_{1,TM} = e^{g_{TM}L_1}$.

Downstream of the first gain section 30 is a 90 degree ($\pi/2$) polarization rotation section 32, having a length $L_{ROT}$. Assuming that the polarization rotation section is passive, this means that the optical energy traversing section 32 will experience optical loss characterized by the values $\alpha_{TE/TM}$ and $\alpha_{TM/TE}$. The notation "$\alpha_{TE/TM}$" refers to optical energy having a TE polarization at the input to the polarization rotation section 32 and a TM polarization at the output of section 32 due to the 90 degree polarization rotation imparted on the input optical energy received from the first gain section 30. Similarly, the notation "$\alpha_{TM/TE}$" refers to optical energy having a TM polarization at the input to the polarization rotation section 32 and a TE polarization at the output of section 32. The passive 90 degree polarization rotation section 32 can be fabricated in any desired manner. Those skilled in the art will appreciate that there are a number of different techniques and semiconductor geometries which can be employed to create the polarization rotation section 32. Some examples include those described in the following technical articles: (1) "Realization of a Compact and Single-Mode Optical Passive Polarization Converter", by J. Z. Huang et al., *IEEE Photonics Technology Letters*, Vol. 12, No. 3, March 2000, pp. 317–19, (2) "First Realized Polarization Converter Based on Hybrid Supermodes", by K. Mertens et al., *IEEE Photonics Technology Letters*, Vol. 10, No.3, March 1998, pp. 388–390, (3) "Realization of a Short Integrated Optic Passive Polarization Converter", by J. J. G. M. van der Tol et al., *IEEE Photonics Technology Letters*, Vol. 7, No. 8, August 1995, pp. 893–895, and (4) "Integrated Multistack Waveguide Polarizer", by J. Fujita, *IEEE Photonics Technology Letters*, Vol. 10, No. 1, January 1998, pp. 93–95, the disclosures of which are incorporated here by reference.

After passing through the polarization rotation section 32, optical energy is then guided through a second (active) gain section 34. The gain section 34 is driven by current $I_2$ and has length $L_2$. Preferably, the second gain section 34 is identical to, or at least substantially similar to, the first gain section 30, i.e., the second gain section 34 also has the same gain characteristic values $g_{TE}$ and $g_{TM}$. In this case, the gain introduced by the second gain section is given by: $G_{2,TE}=e^{gTEL_2}$, $G_{2,TM}=e^{gTML_2}$. Thus, the length of sections 30 and 34, $L_1$ and $L_2$ respectively, should be the same or substantially the same and the drive currents $I_1$ and $I_2$ should also be the same or substantially the same. The overall gain of the device then can be represented by the following equations:

$$G_{TE}=e^{gTEL_1}e^{-\alpha_{TE/TM}L_{ROT}}e^{gTML_2} \quad G_{TM}=e^{gTML_1}e^{-\alpha_{TM/TE}L_{ROT}}e^{gTEL_2}$$

wherein $G_{TE}$ and $G_{TM}$ is the overall gain for optical input signals having TE and TM polarization states, respectively. When $L_1=L_2$ and $\alpha_{TE/TM}=\alpha_{TM/TE}$ then the overall device gain is equal for both TE and TM input polarization states. Note that although the overall gain applied to an output of the SOA in FIG. 3 will be substantially polarization independent, the gain associated with each individual gain section (e.g $G_{1,TE}$ and $G_{1,TM}$) may or may not be substantially polarization independent. Thus, for gain section 30 (and/or gain section 34), the difference between $G_{1,TE}$ and $G_{1,TM}$ ($G_{2,TE}$ and $G_{2,TM}$ in section 34) may be greater than 1 dB, e.g., it may be between 1 and 5 dB or larger if penalties associated with noise figures are acceptable for a particular implementation. To achieve overall polarization insensitivity the gain is balanced between the two gain sections, that is, the TE gain in section 30 substantially equals the TE gain in section 34 ($G_{1,TE}\cong G_{2,TE}$) and the TM gain in section 30 substantially equals the TM gain in section 34 ($G_{1,TM}\cong G_{2,TM}$). This condition can be achieved in a monolithically integrated structure by making the gain sections the same length and biasing them at the same current. Thus, polarization insensitivity of the overall SOA gain is achieved according to exemplary embodiments of the present invention without the need for the difficult task of equilibrating the TE and TM gain in the active gain sections.

Figure 3:
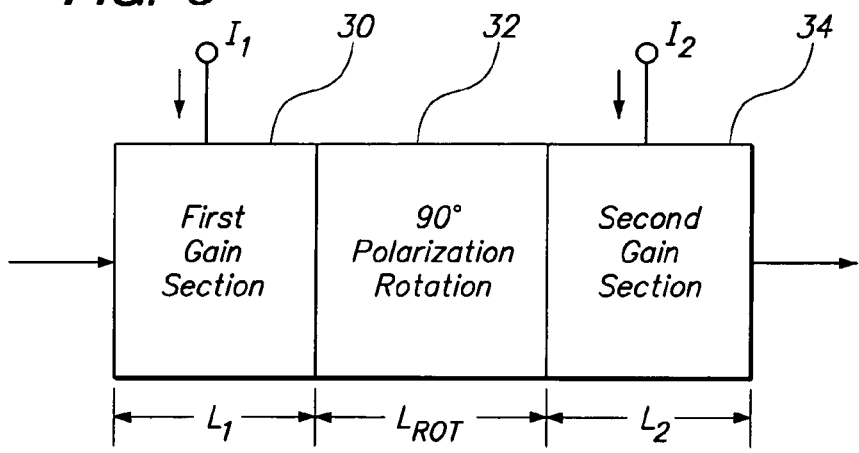
FIG. 3 depicts an SOA according to an exemplary embodiment of the present invention having gain that is substantially polarization independent.
Figure 4:
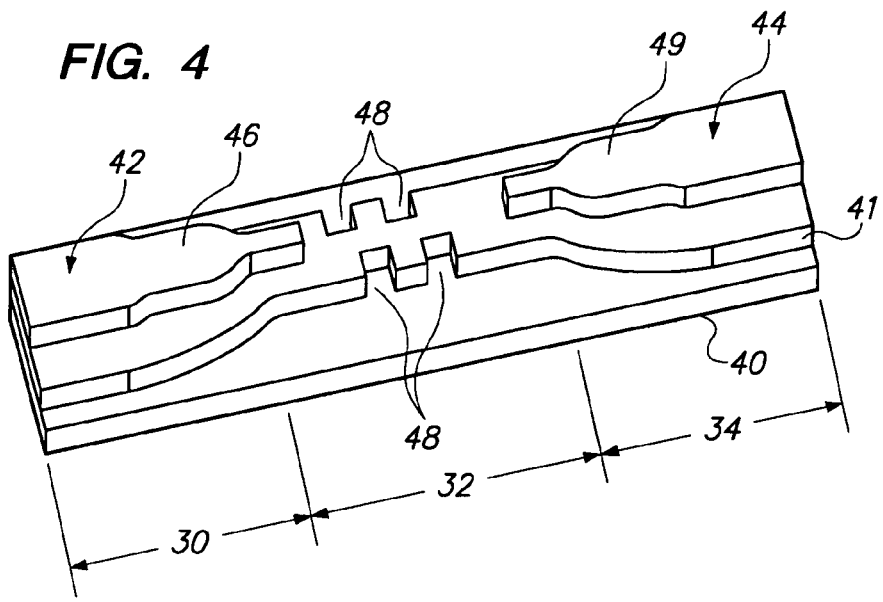
FIG. 4 shows a more detailed example of an SOA having a gain which is substantially polarization independent according to the exemplary embodiment of FIG. 3.

Thus, it can be seen from the foregoing that by fabricating a first gain section 30, a polarization rotation section 32 and a second gain section 34 on a substrate (not shown in FIG. 3) in the manner shown in FIG. 3, an SOA can be manufactured that is substantially polarization independent. There are many different ways to manufacture such a device, i.e., different types of gain sections and polarization rotation sections can be provided on the substrate to create an SOA whose gain is substantially polarization independent according to the present invention. However, a technique for integrating both the active sections and the passive section(s) on a substrate is needed. In one purely illustrative exemplary embodiment, an integration technique employing a resonantly coupled set of active and passive waveguides is used to create the three sections described above on a substrate. More details regarding this type of integration technique using resonantly coupled devices per se can be found in U.S. Pat. No. 6,310,995 (the "'995 patent"), the disclosure of which is incorporated here by reference. The devices described in the '995 patent can be adapted for use in a substantially polarization independent SOA according to the present invention by abutting two such resonantly coupled devices together, as shown in FIG. 4.

Therein, a substrate 40 has a lower passive waveguide 41 and an upper, active waveguide split into two parts 42 and 44. Optical energy enters the SOA of FIG. 4 through the first gain section 30 where it is amplified in the active waveguide 42 by a predetermined gain as described above with respect to FIG. 3. The first gain section 30 also includes an active to passive coupler 46 that includes the tapered portion of the active waveguide. The active to passive coupler 46 couples the optical mode into the passive waveguide 41 of the polarizaton rotation section 32. The lengths and widths associated with the tapered active to passive coupler section 46 are selected to optimize coupling between the modes present in the active waveguide 42 and passive waveguide 41, i.e., to create a taper that results in a phase matching condition occurring within the coupling length of the tapered region. This active to passive coupling phenomenon, as well as exemplary dimensions for the active to passive coupler 46 are described in more detail in the above-incorporated by reference '995 patent.

The polarization rotation section 32 has a structure which imparts 90 degree polarization rotation as described above. In this exemplary embodiment, the polarization rotator is fabricated as a series of openings 48 created by, for example, etching away the passive waveguide 41. The openings 48 are formed in an alternating pattern on opposing sides of the waveguide 41. A polarization rotator having alternating openings is described in the article entitled "Analysis of Polarization Independent Optical Amplifiers and Filters Based on Polarization Rotation in Periodically Asymmetric Waveguides", by Mats Gustavsson, IEEE Journal of Quantum Electronics, Vol. 29, No. 4, April 1993, pp. 1168–78, the disclosure of which is incorporated here by reference. Of course, as mentioned above, other types of the polarization rotation structures can be used in fabricating the passive waveguide 41. For example, an angled-facet structure can be used as described in the above-incorporated article entitled "Realization of a Compact and Single-Mode Optical Passive Polarization Converter". After polarization rotation, the optical energy is then resonantly coupled from the passive waveguide 41 into the active waveguide 44 of the second gain section 34 via passive to active coupler 49. As mentioned above with respect to FIG. 3, the active waveguides 42 and 44 are designed to be substantially similar in this exemplary embodiment of the present invention so as to impart in gain sections 30 and 34 the same, or substantially the same, gain coefficient in the TE and TM polarization components. In this way, the output optical energy from the SOA of FIG. 4 will have a gain that is substantially polarization independent.

Figure 5:
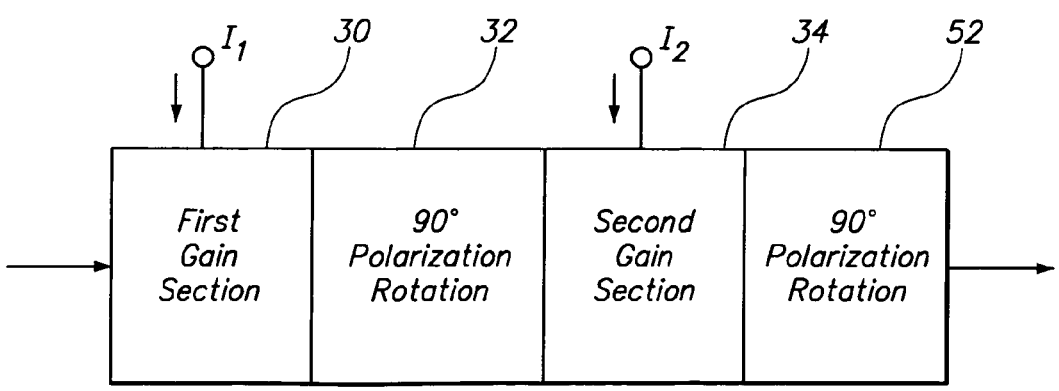
FIG. 5 depicts an SOA according to another exemplary embodiment of the present invention.

Those skilled in the art will appreciate that the present invention can be implemented in embodiments other than those examples described above. For example, if the loss in the passive polarization section 32 is not reciprocal, i.e., if $\alpha_{TE/TM}$ does not equal $\alpha_{TM/TE}$, then the overall gain is not identical for TE and TM input polarization states. This introduces a source of polarization dependency to the overall gain of the SOA which, if it is large enough, should be compensated. Accordingly, in another exemplary embodiment of the present invention, shown in FIG. 5, a second 90 degree polarization section 52 can be placed adjacent to the second gain section 34. Preferably, the second polarization rotation section 52 is identical to, or at least substantially similar to, the first polarization rotation section 32, i.e., the second polarization rotation section 52 also has the same loss coefficient characteristic values $\alpha_{TE/TM}$ and $\alpha_{TM/TE}$ as well as the same length, $L_{rot}$. The overall gain of the device is now given by the following equations:

$$G_{TE}=e^{gTEL}e^{-\alpha_{TE/TM}L_{ROT}}e^{gTML}e^{-\alpha_{TM/TE}L_{ROT}}=e^{(gTE+gTM)L}e^{-(\alpha_{TE/TM}+\alpha_{TM/TE})L_{ROT}}$$

$$G_{TM}=e^{gTML}e^{-\alpha_{TM/TE}L_{ROT}}e^{gTEL}e^{-\alpha_{TM/TE}L_{ROT}}=e^{(gTM+gTE)L}e^{-(\alpha_{TM/TE}+\alpha_{TE/TM})L_{ROT}}$$

wherein L is the length of each gain section. By placing the second 90 degree polarization rotation section 52 as illustrated in FIG. 5, imbalance in the absorption coefficients $\alpha_{TE/TM}$ and $\alpha_{TM/TE}$ in the passive section 32 will be corrected by the additional 90 degree rotation in passive polarization rotation section 52, resulting in an overall device gain that is substantially polarization independent.

Figure 6:
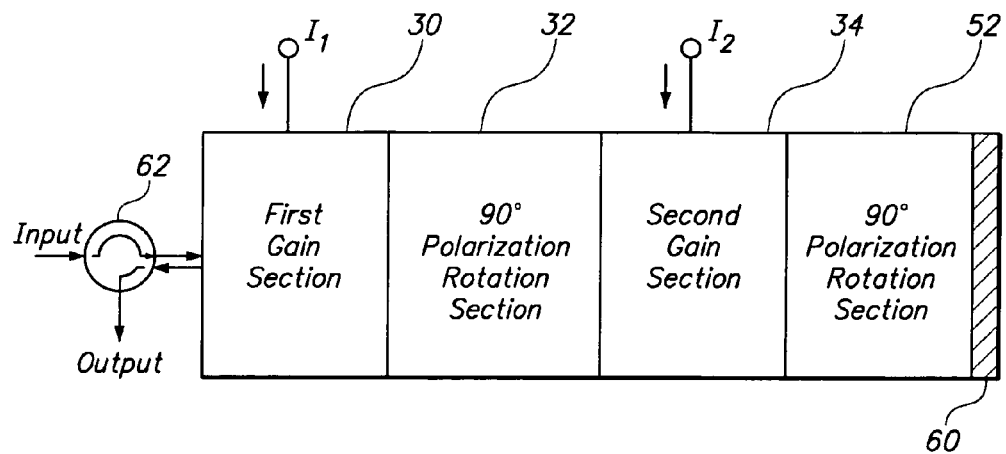
FIG. 6 depicts an SOA according to a reflective exemplary embodiment of the present invention.
Figure 7:
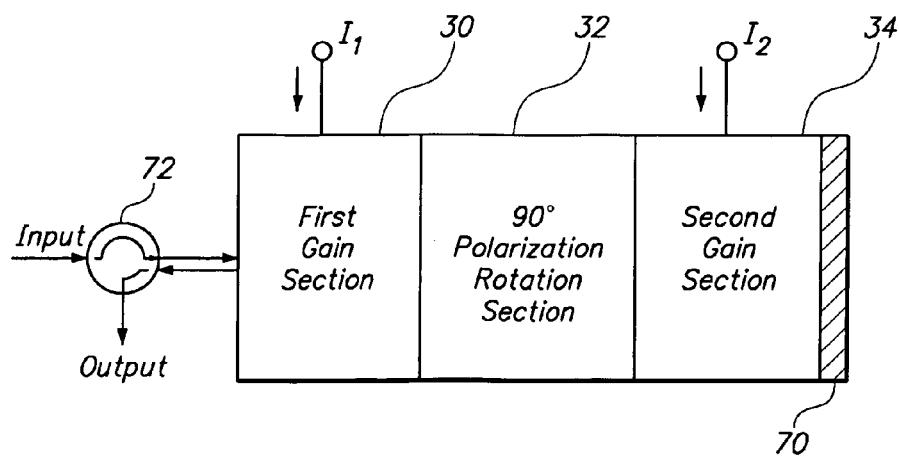
FIG. 7 depicts an SOA according to another reflective exemplary embodiment of the present invention.

Those skilled in the art will appreciate that this technique can also be employed in a two pass (reflective) embodiment as depicted, for example, in FIG. 6. Therein, the structure is substantially similar to that described above with respect to FIG. 5, except that a reflective coating 60 is provided on the surface which receives the output of the second polarization rotation section 52 so that the optical signal returns back through the second polarization rotation section 52, second gain section 34, first polarization rotation section 32 and first gain section 30. Since FIG. 6 is a reflective embodiment, a circulator 62 is provided at the input/output of the SOA to provide for separation of the input optical signal and output (amplified) optical signal. A reflective embodiment of the present invention corresponding to FIG. 3 is depicted in FIG. 7. Therein, the reflective coating 70 reflects the optical signal back through the second gain section 32, first polarization rotation section 32 and first gain section 30 for output via circulator 72.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims. No element, act, or instruction used in the description of the present application should be construed as critical or essential to the invention unless explicitly described as such. Also, as used herein, the article "a" is intended to include one or more items.

What is claimed is:

1. A semiconductor optical amplifier comprising:
   a substrate;
   a first gain section disposed on said substrate for providing gain to an optical signal;
   a first polarization rotation section, adjacent to said first gain section and disposed on said substrate, for rotating a polarization of said optical signal received from said first gain section; and
   a second gain section, adjacent to said first polarization rotation section and disposed on said substrate, for providing gain to said optical signal received from said first polarization rotation section.

2. The semiconductor optical amplifier of claim 1, wherein said first and second gain sections are fabricated using one of quantum well materials and bulk materials.

3. The semiconductor optical amplifier of claim 1, wherein said first and second gain sections receive substantially the same drive current and have substantially the same length.

4. The semiconductor optical amplifier of claim 1, wherein said first and second gain sections include an active to passive coupler and a passive to active coupler, respectively.

5. The semiconductor optical amplifier of claim 4, wherein each of said couplers further comprise a resonant coupler for coupling modes between a respective one of said first and second gain sections and said first polarization rotation section.

6. The semiconductor optical amplifier of claim 1, wherein said first polarization rotation section rotates a polarization of said optical signal by 90 degrees.

7. The semiconductor optical amplifier of claim 1, wherein said first polarization rotation section further comprises a passive waveguide having openings formed in an alternating pattern on opposing sides thereof.

8. The semiconductor optical amplifier of claim 1, wherein said first polarization rotation section further comprises a passive waveguide having an angled-facet waveguide structure.

9. The semiconductor optical amplifier of claim 1, further comprising a second polarization rotation section adjacent to said second gain section and disposed on said substrate for rotating a polarization of said optical signal received from said second gain section.

10. The semiconductor optical amplifier of claim 9, wherein said second polarization rotation section rotates a polarization of said optical signal by 90 degrees.

11. The semiconductor optical amplifier of claim 9, wherein said second polarization rotation section further comprises a passive waveguide having openings formed in an alternating pattern on opposing sides thereof.

12. The semiconductor optical amplifier of claim 9, wherein said second polarization rotation section further comprises a passive waveguide having an angled-facet waveguide structure.

13. A semiconductor optical amplifier comprising:
   substrate means for integrating elements of said semiconductor optical amplifier thereon;
   first gain means, disposed on said substrate, for providing gain to an optical signal;
   first polarization rotation means, adjacent to said first gain means and disposed on said substrate means, for rotating a polarization of said optical signal received from said first gain means; and
   second gain means, adjacent to said first polarization rotation means and disposed on said substrate means, for providing gain to said optical signal received from said first polarization rotation means.

14. The semiconductor optical amplifier of claim 13, wherein said first and second gain means includes one of quantum wells and bulk materials.

15. The semiconductor optical amplifier of claim 13, wherein said first and second gain means receive substantially the same drive current and have substantially the same length.

16. The semiconductor optical amplifier of claim 13, wherein said first and second gain means include coupling means for moving said optical signal between said first gain means and said first polarization rotation means and said polarization rotation means and said second gain means, respectively.

17. The semiconductor optical amplifier of claim 16, wherein each of said coupling means further comprise a resonant coupler device.

18. The semiconductor optical amplifier of claim 13, wherein said first polarization rotation means rotates a polarization of said optical signal by 90 degrees.

19. The semiconductor optical amplifier of claim 13, wherein said first polarization rotation means further comprises passive waveguide means having openings formed in an alternating pattern on opposing sides thereof.

20. The semiconductor optical amplifier of claim 13, wherein said first polarization rotation means further comprises passive waveguide means having an angled-facet waveguide structure.

21. The semiconductor optical amplifier of claim 13, further comprising second polarization rotation means, adjacent to said second gain means, for rotating a polarization of said optical signal and disposed on said substrate means for rotating a polarization of said optical signal received from said second gain means.

22. The semiconductor optical amplifier of claim 21, wherein said second polarization rotation means rotates a polarization of said optical signal by 90 degrees.

23. The semiconductor optical amplifier of claim 21, wherein said second polarization rotation means further comprises a passive waveguide having openings formed in an alternating pattern on opposing sides thereof.

24. The semiconductor optical amplifier of claim 21, wherein said second polarization rotation means further comprises a passive waveguide having an angled-facet waveguide structure.

25. A semiconductor optical amplifier comprising:
a substrate; and
at least one active, gain section provided on said substrate for providing gain to an input optical signal, wherein said gain has a transverse electric (TE) component and a transverse magnetic (TM) component, a difference between said TE component and said TM component being more than 1 dB; and
polarization rotation means for rotating a polarization associated with said input optical signal, both said at least one gain section and said polarization rotation means being integrated onto said substrate, wherein said polarization rotation means is provided in a passive section on said substrate,
wherein said semiconductor optical amplifier has an overall gain with a difference between a TE component and a TM component of less than 1 dB.

26. The semiconductor optical amplifier of claim 25, wherein said at least one gain section is fabricated using one of quantum well material and bulk material.

27. The semiconductor optical amplifier of claim 25, wherein said polarization rotation means rotates a polarization of said input optical signal by 90 degrees.

28. The semiconductor optical amplifier of claim 25, wherein said polarization rotation means further comprises a passive waveguide having openings formed in an alternating pattern on opposing sides thereof.

29. The semiconductor optical amplifier of claim 25, wherein said polarization rotation means further comprises a passive waveguide having an angled-facet waveguide structure.

30. The semiconductor optical amplifier of claim 25, wherein said overall gain has a difference between said TE component and and said TM component of less than 0.5 dB.

31. A method for amplifying an optical signal comprising the steps of:
disposing, on a substrate; a first gain section, a first polarization rotation section, and a second gain section;
amplifying said optical signal in said a first gain section to generate a first amplified optical signal;
rotating a polarization of said first amplified optical signal in said first polarization rotation section to generate a polarization rotated optical signal; and
amplifying said polarization rotated optical signal in said second gain section to generate a second amplified optical signal.

32. The method of claim 31, further comprising the step of:
fabricating said first and second gain sections using one of quantum well materials and bulk materials.

33. The method of claim 31, further comprising the step of:
driving said first and second gain sections with substantially the same drive current.

34. The method of claim 31, further comprising the step of:
providing said first and second gain sections with an active to passive coupler and a passive to active coupler, respectively.

35. The method of claim 34, wherein each of said couplers further comprise a resonant coupler for coupling modes between a respective one of said first and second gain sections and said first polarization rotation section.

36. The method of claim 31, wherein said step of rotating further comprises the step of:
rotating said first amplified optical signal by 90 degrees.

37. The method of claim 31, wherein said first polarization rotation section further comprises a passive waveguide having openings formed in an alternating pattern on opposing sides thereof.

38. The method of claim 31, wherein said first polarization rotation section further comprises a passive waveguide having an angled-facet waveguide structure.

39. The method of claim 31, further comprising the step of:
rotating a polarization of said second amplified optical signal.

40. The method of claim 39, further comprising the step of:
reflecting said rotated, second amplified signal.

41. The semiconductor optical amplifier of claim 21, further comprising:
a reflective coating disposed adjacent to said second polarization rotation section for reflecting an output of said second polarization rotation section.

42. The semiconductor optical amplifier of claim 9, further comprising:
a reflective coating disposed adjacent to said second polarization rotation section for reflecting an output of said second polarization rotation section.

43. The method of claim 31, further comprising the step of:
reflecting said second amplified optical signal.

44. The semiconductor optical amplifier of claim 13, further comprising:
a reflective coating disposed adjacent to said second gain section for reflecting an output of said second gain section.

45. The semiconductor optical amplifier of claim 1, further comprising:
a reflective coating disposed adjacent to said second gain section for reflecting an output of said second gain section.

* * * * *